(12) United States Patent
Nishio

(10) Patent No.: US 12,176,885 B2
(45) Date of Patent: Dec. 24, 2024

(54) FILTER DEVICE, MULTIPLEXER, AND COMMUNICATION DEVICE

(71) Applicant: Murata Manufacturing Co., Ltd., Kyoto (JP)

(72) Inventor: Keisuke Nishio, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 714 days.

(21) Appl. No.: 17/358,484

(22) Filed: Jun. 25, 2021

(65) Prior Publication Data

US 2022/0006443 A1 Jan. 6, 2022

(30) Foreign Application Priority Data

Jul. 1, 2020 (JP) .................................. 2020-114191

(51) Int. Cl.
*H03H 9/64* (2006.01)
*H03H 7/46* (2006.01)
*H04B 1/40* (2015.01)

(52) U.S. Cl.
CPC .............. *H03H 9/64* (2013.01); *H03H 7/46* (2013.01); *H04B 1/40* (2013.01)

(58) Field of Classification Search
CPC ............... H03H 9/64; H03H 7/46; H04B 1/40
See application file for complete search history.

(56) References Cited

U.S. PATENT DOCUMENTS

| 10,263,600 | B2 * | 4/2019 | Tsukamoto | ............ H03H 9/703 |
| 2004/0119561 | A1 | 6/2004 | Omote | |
| 2004/0251990 | A1 * | 12/2004 | Ueda | .................... H03H 9/6433 |
| | | | | 333/195 |
| 2016/0218696 | A1 * | 7/2016 | Nosaka | ................. H03H 9/6423 |
| 2017/0338801 | A1 * | 11/2017 | Hey-Shipton | .......... H03H 9/725 |
| 2019/0028085 | A1 | 1/2019 | Kato et al. | |

FOREIGN PATENT DOCUMENTS

| JP | 2004-173245 A | 6/2004 |
| JP | 2012-156881 A | 8/2012 |
| JP | 2016-054374 A | 4/2016 |
| JP | 2019-024155 A | 2/2019 |

\* cited by examiner

*Primary Examiner* — Muthuswamy G Manoharan
(74) *Attorney, Agent, or Firm* — Pearne & Gordon LLP

(57) ABSTRACT

A filter includes first and second input/output terminals; an LC parallel resonance circuit that includes an inductor L1 and a capacitor C1 connected to each other in parallel; and an acoustic wave series resonance circuit that includes series arm resonators s1 and s2 connected to each other in series. The LC parallel resonance circuit and the acoustic wave series resonance circuit are connected to each other in series between the first input/output terminal and the second input/output terminal.

12 Claims, 11 Drawing Sheets freq(700MHz to 1.7GHz)

(fr3,fa3)

(fr2,fa2)

(fr9,fa9)

FILTER DEVICE, MULTIPLEXER, AND COMMUNICATION DEVICE

CROSS REFERENCE TO RELATED APPLICATION

This application claims priority from Japanese Patent Application No. 2020-114191 filed on Jul. 1, 2020. The content of this application is incorporated herein by reference in its entirety.

BACKGROUND

The present disclosure relates to a filter device, a multiplexer, and a communication device.

Along with the development of multiband front end circuits of mobile terminals, filter devices having a wide and low-loss pass band and a narrow and steep stop band have been demanded.

Japanese Unexamined Patent Application Publication No. 2012-156881 discloses a filter including two surface acoustic wave resonators connected to each other in series. The stop band of the filter is defined by the anti-resonant frequencies of the two surface acoustic wave resonators.

BRIEF SUMMARY

However, it is difficult for the filter described in Japanese Unexamined Patent Application Publication No. 2012-156881 to have a wide and low-loss pass band, a wide stop band, and a narrow and steep stop band that achieve isolation between a plurality of communication bands having various band widths.

The present disclosure provides a multiband filter device, a multiplexer, and a communication device that have a wide and low-loss pass band, a wide stop band, and a narrow and steep stop band.

According to embodiments of the present disclosure, there is provided a filter device including: a first input/output terminal and a second input/output terminal; an LC parallel resonance circuit that includes a first inductor and a first capacitor connected to each other in parallel; and an acoustic wave series resonance circuit that includes a first acoustic wave resonator and a second acoustic wave resonator connected to each other in series. The LC parallel resonance circuit and the acoustic wave series resonance circuit are connected to each other in series between the first input/output terminal and the second input/output terminal.

According to the present disclosure, the multiband filter device, the multiplexer, and the communication device that have the wide and low-loss pass band, the wide stop band, and the narrow and steep stop band can be provided. Other features, elements, characteristics and advantages of the present disclosure will become more apparent from the following detailed description of embodiments of the present disclosure with reference to the attached drawings.

DETAILED DESCRIPTION

Now, embodiments, examples, and modifications thereof of the present disclosure are described in detail with reference to the drawings. Note that, the embodiments, examples, and modifications described below describe comprehensive or specific examples. The numerical values, shapes, materials, components, component arrangements, connection modes, and the like described in the following embodiments, examples, and modifications are examples and not intended to limit the present disclosure. Components that are not described in the independent claims among the components in the following embodiments, examples, and modifications are described as optional components.

Further, in the present disclosure, the phrase "including a circuit element" includes not only including the circuit element in question alone, but also including another circuit element in addition to the circuit element in question. That is, "including a circuit element" does not exclude the inclusion of another circuit element.

Embodiment 1

[1.1 Circuit Configuration and High-Frequency Characteristics of Filter 1]

Figure 1A:
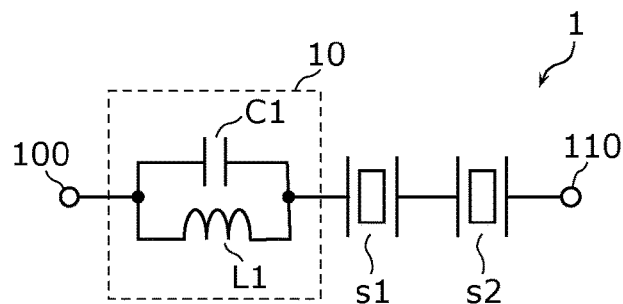
FIG. 1A is a circuit configuration diagram of a filter device according to Embodiment 1.

FIG. 1A is a circuit configuration diagram of a filter 1 according to Embodiment 1. The filter 1 is an example of a filter device, and includes, as illustrated in FIG. 1A, input/output terminals 100 and 110, an LC parallel resonance circuit 10, and series arm resonators s1 and s2.

The input/output terminal 100 is an example of a first input/output terminal, and is a terminal for receiving high-frequency signals input from the outside or outputting high-frequency signals to the outside. The input/output terminal 110 is an example of a second input/output terminal, and is a terminal for outputting high-frequency signals to the outside or receiving high-frequency signals input from the outside.

The LC parallel resonance circuit 10 includes an inductor L1 (first inductor) and a capacitor C1 (first capacitor) connected to each other in parallel.

The series arm resonator s1 is an example of a first acoustic wave resonator, and is a resonator using surface acoustic waves (SAWs). The series arm resonator s2 is an example of a second acoustic wave resonator, and is a resonator using surface acoustic waves. The series arm resonator s1 and the series arm resonator s2 are connected to each other in series so that the series arm resonators s1 and s2 form an acoustic wave series resonance circuit.

The LC parallel resonance circuit 10 and the acoustic wave series resonance circuit are connected to each other in series between the input/output terminals 100 and 110. In other words, on the series arm path that connects the input/output terminal 100 and the input/output terminal 110 to each other, the input/output terminal 100, the LC parallel resonance circuit 10, the acoustic wave series resonance circuit, and the input/output terminal 110 are disposed in this order.

Note that, the acoustic wave series resonance circuit may include three or more series arm resonators.

Note that, other circuit elements are desirably not connected to the connection node between the series arm resonator s1 and the series arm resonator s2, and the series arm resonator s1 and the series arm resonator s2 are desirably directly connected to each other. Further, other circuit elements are desirably not connected to the connection node between the LC parallel resonance circuit 10 and the series arm resonator s1, and the LC parallel resonance circuit 10 and the series arm resonator s1 are desirably directly connected to each other.

Figure 1B:
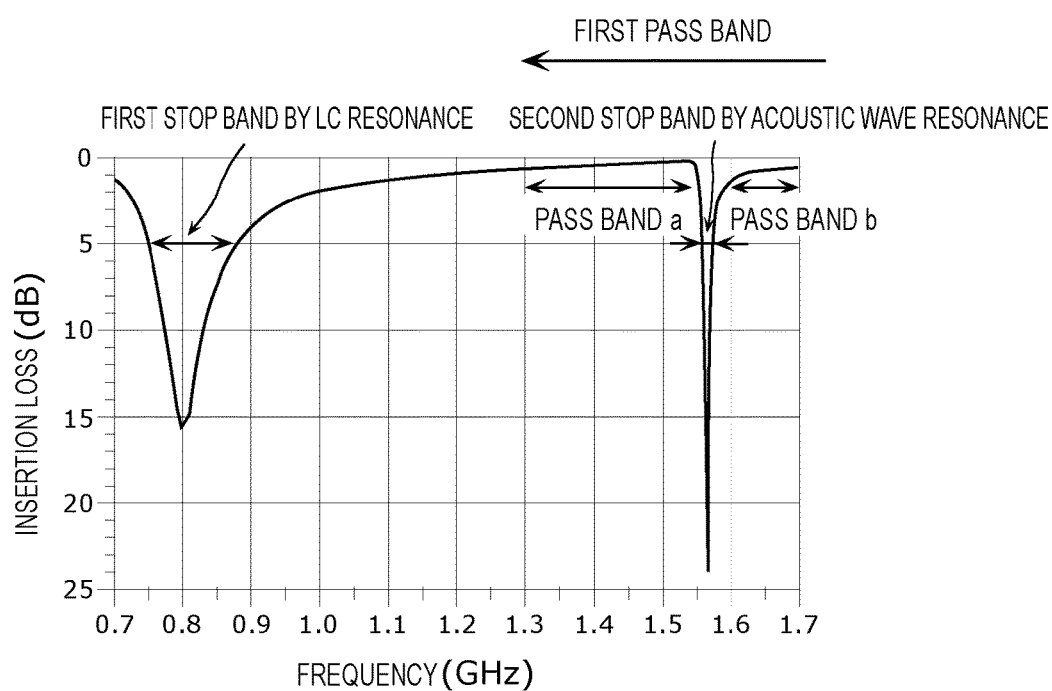
FIG. 1B is a graph illustrating the bandpass characteristics of the filter device according to Embodiment 1.

FIG. 1B is a graph illustrating the bandpass characteristics of the filter 1 according to Embodiment 1. FIG. 1B illustrates the bandpass characteristics between the input/output terminal 100 and the input/output terminal 110 of the filter 1.

The LC parallel resonance circuit 10 forms a wide and low-loss first pass band including a pass band a and a pass band b that are illustrated in FIG. 1B, and a wide first stop band corresponding to the LC parallel resonant frequency of the inductor L1 and the capacitor C1. In the present embodiment, the LC parallel resonance circuit 10 forms a high pass filter. Note that, the LC parallel resonance circuit 10 may be any of a low pass filter, a band pass filter, and a band reject filter.

Meanwhile, the acoustic wave series resonance circuit forms a narrow and steep second stop band corresponding to an anti-resonant frequency fa1 of the series arm resonator s1 and an anti-resonant frequency fa2 of the series arm resonator s2. Note that, the second stop band is included in the frequency range of the first pass band.

With the above-mentioned configuration of the filter 1, a multiband filter device having the wide and low-loss pass band, the wide stop band, and the narrow and steep stop band can be provided. Now, the detailed circuit configuration and high-frequency characteristics of the filter 1 according to the present embodiment are described.

Figure 2A:
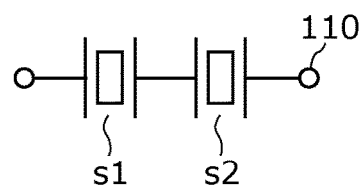
FIG. 2A is a circuit configuration diagram of an acoustic wave series resonance circuit according to Embodiment 1.
Figure 2B:
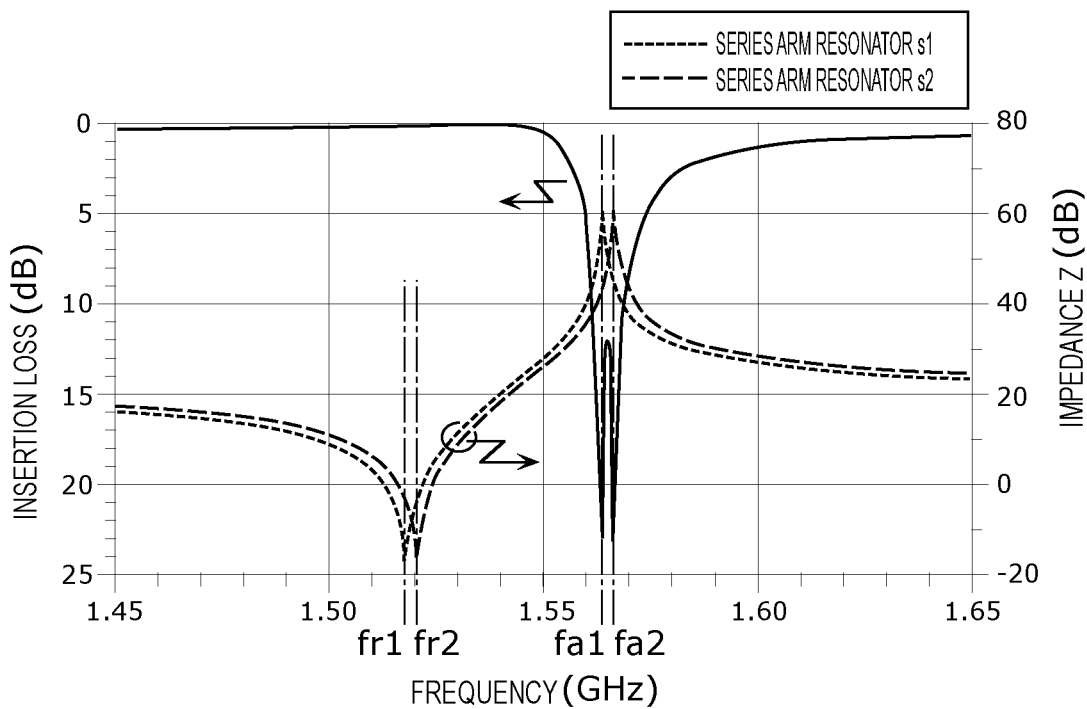
FIG. 2B is a graph illustrating the bandpass characteristics and impedance characteristics of the simple acoustic wave series resonance circuit according to Embodiment 1.

FIG. 2A is a circuit configuration diagram of the acoustic wave series resonance circuit according to Embodiment 1. FIG. 2B is a graph illustrating the bandpass characteristics and impedance characteristics of the simple acoustic wave series resonance circuit according to Embodiment 1. As illustrated in FIG. 2B, an impedance indicating the resonance characteristics of the series arm resonator s1 has a minimum value approaching 0 at a resonant frequency fr1, and a maximum value approaching infinity at the anti-resonant frequency fa1. Further, an impedance indicating the resonance characteristics of the series arm resonator s2 has a minimum value approaching 0 at a resonant frequency fr2, and a maximum value approaching infinity at the anti-resonant frequency fa2. With this, the acoustic wave series resonance circuit forms the low-loss pass band near the resonant frequencies fr1 and fr2 where the insertion loss is small, and forms the stop band at the anti-resonant frequencies fa1 and fa2 where the insertion loss is maximum. Further, the acoustic wave series resonance circuit forms the pass band in the band on the high frequency side of the stop band in question. Since the series arm resonators s1 and s2 have high resonance Q values due to the acoustic wave resonators, the steep attenuation slopes can be formed in the respective end portions of the stop band. In other words, the acoustic wave series resonance circuit forms a band reject filter having the stop band corresponding to the anti-resonant frequencies fa1 and fa2.

Note that, by setting the anti-resonant frequencies of the series arm resonators s1 and s2 to different values, the band width and attenuation of the stop band of the acoustic wave series resonance circuit can be adjusted.

Figure 3A:
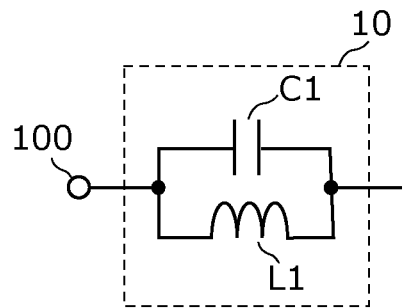
FIG. 3AA includes a circuit configuration diagram of an LC parallel resonance circuit according to Embodiment 1, and FIG. 3AB includes a Smith chart illustrating the impedance characteristics of the LC parallel resonance circuit.
Figure 3A:
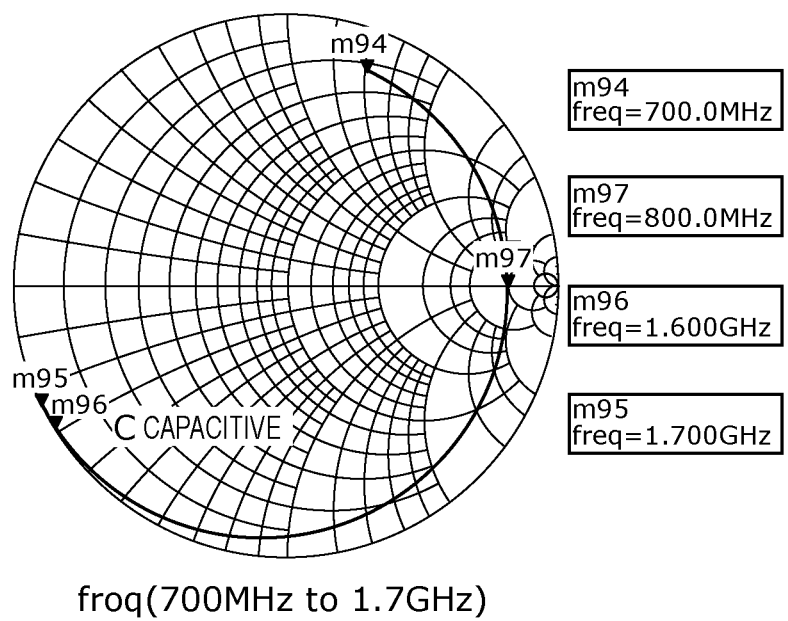

Here, FIG. 3AA is a circuit configuration diagram of the LC parallel resonance circuit 10 according to Embodiment 1, and FIG. 3AB is a Smith chart illustrating the impedance characteristics of the LC parallel resonance circuit 10 according to Embodiment 1. As illustrated in FIG. 3AB, the input/output impedance of the LC parallel resonance circuit 10 is inductive in a low frequency band of 700 to 800 MHz, and is capacitive in a high frequency band of 1000 to 1700 MHz.

Figure 3B:
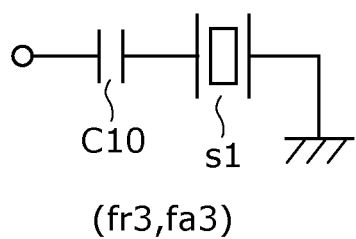
FIGS. 3BA and 3BB are an equivalent circuit diagram of two series arm resonators in a predetermined frequency band of the filter device according to Embodiment 1.
Figure 3B:
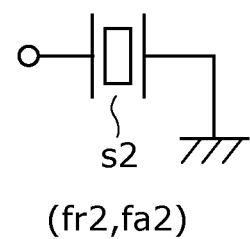

FIGS. 3BA and 3BB are an equivalent circuit diagram of two series arm resonators in a predetermined frequency band of the filter 1 according to Embodiment 1. As illustrated in FIG. 3BA, the LC parallel resonance circuit 10 is replaced by a capacitor C10 in 1000 to 1700 MHz. Here, a resonant frequency fr3 and an anti-resonant frequency fa3 of a series connection circuit including the capacitor C10 and the series arm resonator s1 are defined.

Figure 3C:
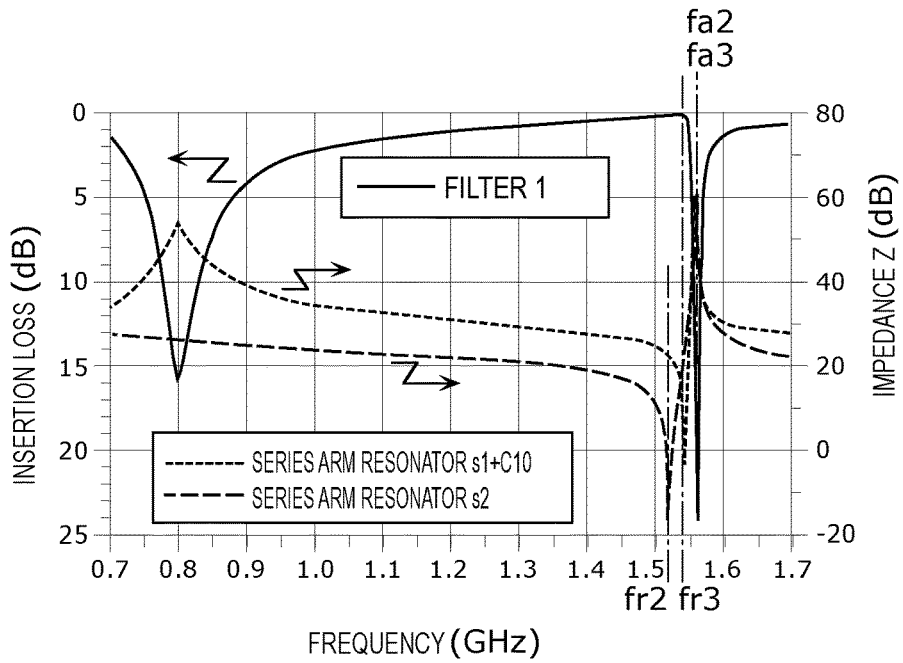
FIG. 3C is a graph illustrating the bandpass characteristics of the filter device according to Embodiment 1 and the impedance characteristics of the two series arm resonators.

FIG. 3C is a graph illustrating the bandpass characteristics of the filter 1 according to Embodiment 1 and the impedance characteristics of the two series arm resonators. FIG. 3C illustrates the bandpass characteristics of the filter 1, the impedance characteristics of the series connection circuit including the series arm resonator s1 and the capacitor C10, and the impedance characteristics of the series arm resonator s2.

As illustrated in FIG. 3C, the attenuation poles of the second stop band of the filter 1 are defined by the anti-resonant frequency fa3 of the series connection circuit and the anti-resonant frequency fa2 of the series arm resonator s2. Here, the low-frequency-side attenuation slope of the second stop band is defined by a resonance band width that is a frequency difference between the resonant frequency fr3 of the series connection circuit and the resonant frequency fr2 of the series arm resonator s2, and the anti-resonant frequency fa3 of the series connection circuit and the anti-resonant frequency fa2 of the series arm resonator s2. As the resonance band width is widened, the attenuation slope becomes gentle, and as the resonance band width is narrowed, the attenuation slope becomes steep.

In the filter 1 according to the present embodiment, the resonant frequency fr3 of the series connection circuit in which the capacitor C10 is connected to the series arm resonator s1 in series is positioned on the high frequency side of the resonant frequency fr1 of the simple series arm resonator s1.

Figure 4A:
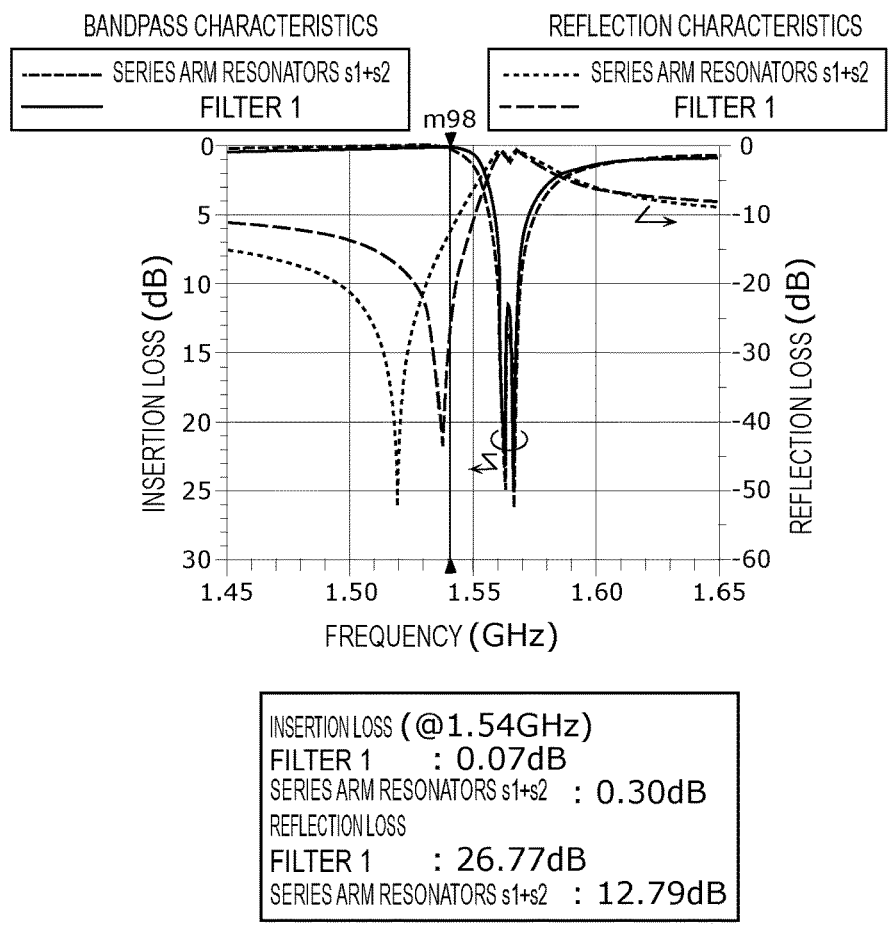
FIG. 4A is a graph illustrating a comparison between the filter device and the simple acoustic wave series resonance circuit according to Embodiment 1 in terms of bandpass characteristics and reflection characteristics near a second stop band.

FIG. 4A is a graph illustrating a comparison between the filter 1 and the simple acoustic wave series resonance circuit (illustrated as "series arm resonators s1+s2" in FIG. 4A) according to Embodiment 1 in terms of bandpass characteristics and reflection characteristics near the second stop band. The filter 1 is a circuit in which the capacitor C10 is equivalently connected to the acoustic wave series resonance circuit in series. Thus, a point at which the return loss of the filter 1 is maximum (the resonant frequency of the series connection circuit including the acoustic wave series resonance circuit and the capacitor C10) is shifted to the high frequency side of a point at which the return loss of the simple acoustic wave series resonance circuit is maximum. Meanwhile, a point at which the return loss of the filter 1 is minimum (the anti-resonant frequency of the series connection circuit including the acoustic wave series resonance circuit and the capacitor C10) is at the same frequency as a point at which the return loss of the simple acoustic wave series resonance circuit is minimum. With this, in the bandpass characteristics of the filter 1, the attenuation slope on the low frequency side of the second stop band is steep. Thus, the insertion loss (0.07 dB) in the high-frequency end portion (1.54 GHz in FIG. 4A) in the pass band on the low frequency side of the second stop band is smaller than the insertion loss (0.30 dB) in the high-frequency end portion (1.54 GHz in FIG. 4A) in the pass band on the low frequency side of the second stop band of the simple acoustic wave series resonance circuit.

Figure 4B:
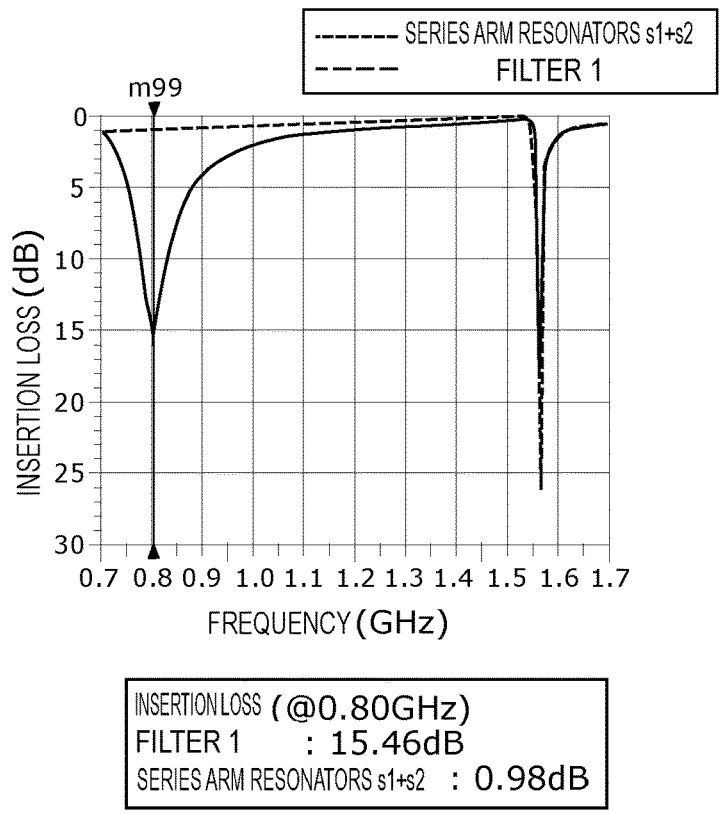
FIG. 4B is a graph illustrating a comparison between the filter device and the simple acoustic wave series resonance circuit according to Embodiment 1 in terms of bandpass characteristics near a first stop band.

FIG. 4B is a graph illustrating a comparison between the filter 1 and the simple acoustic wave series resonance circuit (illustrated as "series arm resonators s1+s2" in FIG. 4B) according to Embodiment 1 in terms of bandpass characteristics near the first stop band. As illustrated in FIG. 4B, in the simple acoustic wave series resonance circuit, no stop band is formed on the low frequency side of the first pass band (0.98 dB@0.80 GHz), but the wide first stop band (15.46 dB@0.80 GHz) is formed on the low frequency side of the first pass band by the LC parallel resonance circuit 10 in the filter 1.

As described above, with the filter 1 according to the present embodiment, the wide first pass band and the wide first stop band can be formed by the LC parallel resonance circuit 10, and the narrow and steep second stop band can be formed by the acoustic wave series resonance circuit. Moreover, insertion loss in the high-frequency-side end portion of the first pass band (pass band a) that is adjacent to the second stop band can be reduced by the combined circuit of the acoustic wave series resonance circuit and the LC parallel resonance circuit 10. That is, the filter 1 according to the present embodiment can have the wide and low-loss first pass band, the wide first stop band, and the narrow and steep second stop band.

Note that, in the present embodiment, the steep attenuation slopes of the second stop band are formed by utilizing the fact that the LC parallel resonance circuit 10 has a capacitive impedance in 1000 to 1700 MHz. In contrast to this, in a case where the second stop band is positioned near 700 to 800 MHz, the second stop band having a wide attenuation band width can be formed by utilizing the fact that the LC parallel resonance circuit 10 has an inductive impedance in 700 to 800 MHz.

[1.2 Resonance Characteristics of Filter According to Modification]

Figure 5A:
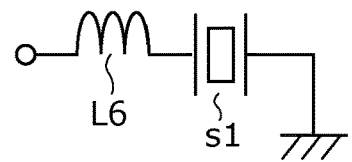
FIG. 5AA includes a diagram of the circuit configuration of a resonance circuit according to Modification 1 of Embodiment 1, and FIG. 5AB includes a graph illustrating the impedance characteristics of the resonance circuit in question.
Figure 5A:
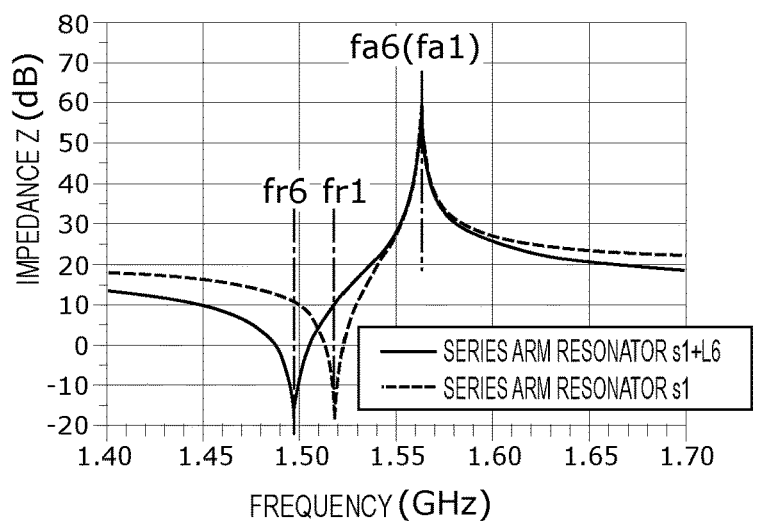

FIG. 5AA includes a diagram of the circuit configuration of a resonance circuit according to Modification 1 of Embodiment 1, and FIG. 5AB includes a graph illustrating the impedance characteristics of the resonance circuit in question. The filter 1 according to Embodiment 1 includes the resonance circuit including the series arm resonator s1 and the equivalent capacitor C10 connected thereto in series. However, a filter according to this modification includes a resonance circuit in which an inductor L6 (third inductor) is connected to the series arm resonator s1 in series instead of the capacitor C10. Here, a resonant frequency fr6 and an anti-resonant frequency fa6 of the resonance circuit including the inductor L6 and the series arm resonator s1 are defined. In the filter according to this modification, the resonant frequency fr6 of the resonance circuit in which the inductor L6 is connected to the series arm resonator s1 in series is positioned on the low frequency side of the resonant frequency fr1 of the simple series arm resonator s1. Further, the anti-resonant frequency fa6 of the resonance circuit in which the inductor L6 is connected to the series arm resonator s1 in series is the same as the anti-resonant frequency fa1 of the simple series arm resonator s1. That is, the resonance band width of the above-mentioned resonance circuit is wider than the resonance band width of the series arm resonator s1.

With this, in the filter according to this modification, the band width of the second stop band can be widened.

Figure 5B:
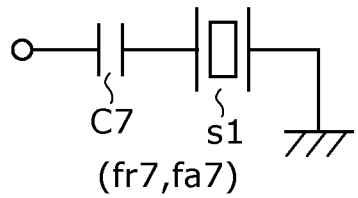
FIG. 5BA includes a diagram of the circuit configuration of a resonance circuit according to Modification 2 of Embodiment 1, and FIG. 5BB includes a graph illustrating the impedance characteristics of the resonance circuit in question.
Figure 5B:
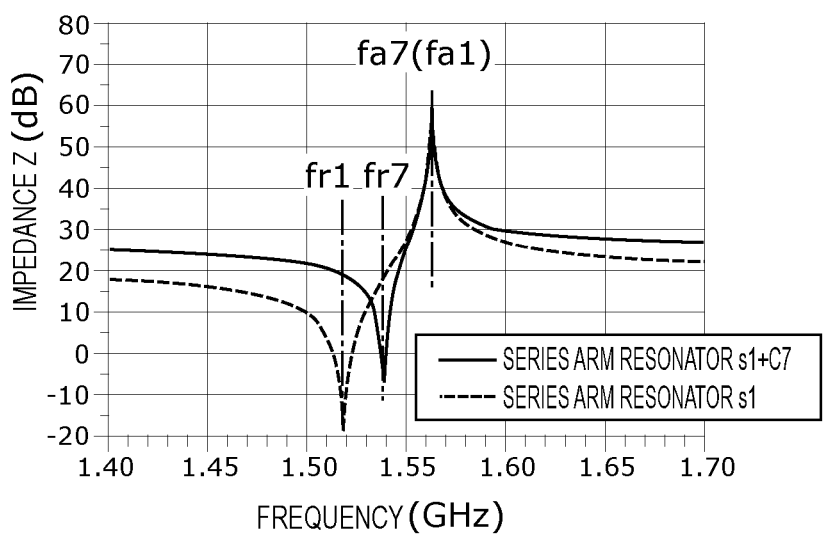

FIG. 5BA includes a diagram of the circuit configuration of a resonance circuit according to Modification 2 of Embodiment 1, and FIG. 5BB includes a graph illustrating the impedance characteristics of the resonance circuit in question. A filter according to this modification includes, like the filter 1 according to Embodiment 1, a resonance circuit in which a capacitor C7 (third capacitor) is connected to the series arm resonator s1 in series. Here, a resonant frequency fr7 and an anti-resonant frequency fa7 of the resonance circuit including the capacitor C7 and the series arm resonator s1 are defined. In the filter according to this modification, the resonant frequency fr7 of the resonance circuit in which the capacitor C7 is connected to the series arm resonator s1 in series is positioned on the high frequency side of the resonant frequency fr1 of the simple series arm resonator s1. Further, the anti-resonant frequency fa7 of the resonance circuit in which the capacitor C7 is connected to the series arm resonator s1 in series is the same as the anti-resonant frequency fa1 of the simple series arm resonator s1. That is, the resonance band width of the above-mentioned resonance circuit is narrower than the resonance band width of the series arm resonator s1.

With this, in the filter according to this modification, the attenuation slopes of the second stop band can be steepened.

Figure 5C:
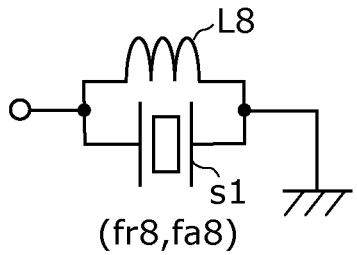
FIG. 5CA includes a diagram of the circuit configuration of a resonance circuit according to Modification 3 of Embodiment 1, and FIG. 5CB includes a graph illustrating the impedance characteristics of the resonance circuit in question.
Figure 5C:
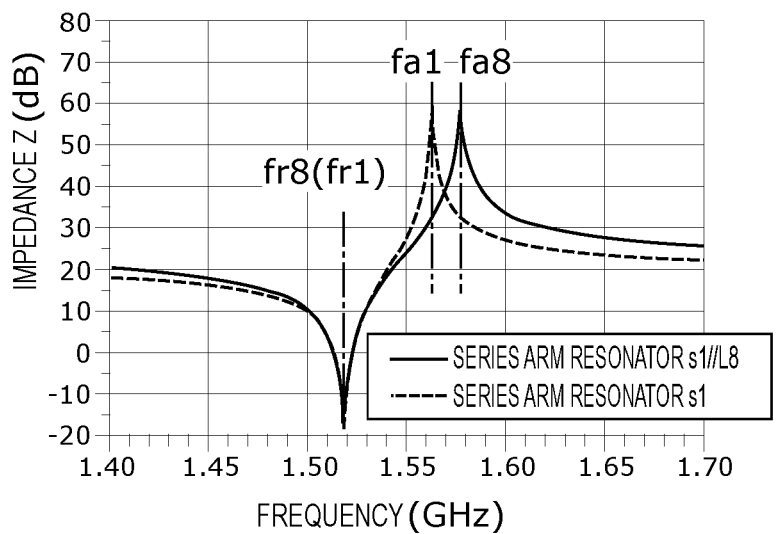

FIG. 5CA includes a diagram of the circuit configuration of a resonance circuit according to Modification 3 of Embodiment 1, and FIG. 5CB includes a graph illustrating the impedance characteristics of the resonance circuit in question. The filter 1 according to Embodiment 1 includes the resonance circuit including the series arm resonator s1 and the equivalent capacitor C10 connected thereto in series. However, a filter according to this modification includes a resonance circuit in which an inductor L8 (fourth inductor) is connected to the series arm resonator s1 in parallel instead of the capacitor C10. Here, a resonant frequency fr8 and an anti-resonant frequency fa8 of the resonance circuit including the inductor L8 and the series arm resonator s1 are defined. In the filter according to this modification, the anti-resonant frequency fa8 of the resonance circuit in which the inductor L8 is connected to the series arm resonator s1 in parallel is positioned on the high frequency side of the anti-resonant frequency fa1 of the simple series arm resonator s1. Further, the resonant frequency fr8 of the resonance circuit in which the inductor L8 is connected to the series arm resonator s1 in parallel is the same as the resonant frequency fr1 of the simple series arm resonator s1. That is, the resonance band width of the above-mentioned resonance circuit is wider than the resonance band width of the series arm resonator s1.

With this, in the filter according to this modification, the band width of the second stop band can be widened.

Figure 5D:
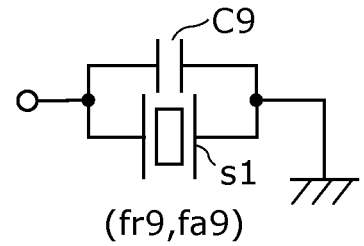
FIG. 5DA includes a diagram of the circuit configuration of a resonance circuit according to Modification 4 of Embodiment 1, and FIG. 5DB includes a graph illustrating the impedance characteristics of the resonance circuit in question.
Figure 5D:
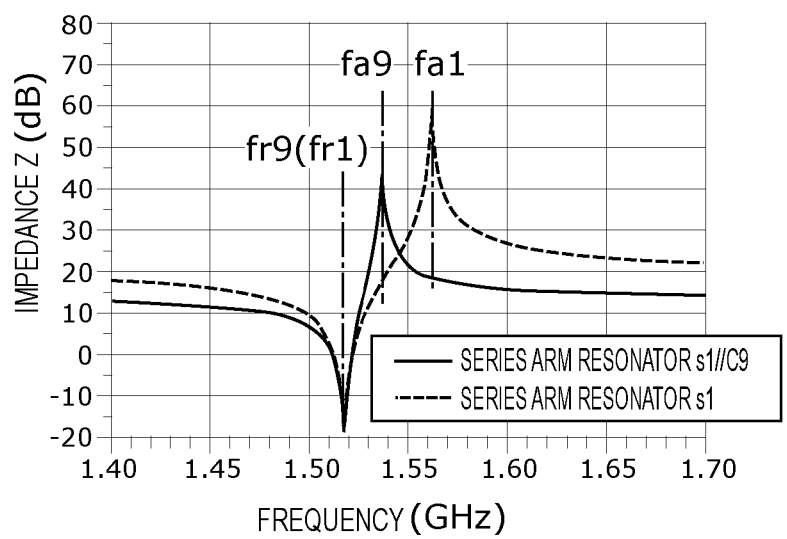

FIG. 5DA includes a diagram of the circuit configuration of a resonance circuit according to Modification 4 of Embodiment 1, and FIG. 5DB includes a graph illustrating the impedance characteristics of the resonance circuit in question. The filter 1 according to Embodiment 1 includes the resonance circuit including the series arm resonator s1 and the equivalent capacitor C10 connected thereto in series. However, a filter according to this modification includes a resonance circuit in which a capacitor C9 (fourth capacitor) is connected to the series arm resonator s1 in parallel instead of the capacitor C10. Here, a resonant frequency fr9 and an anti-resonant frequency fa9 of the resonance circuit including the capacitor C9 and the series arm resonator s1 are defined. In the filter according to this modification, the anti-resonant frequency fa9 of the resonance circuit in which the capacitor C9 is connected to the series arm resonator s1 in parallel is positioned on the low frequency side of the anti-resonant frequency fa1 of the simple series arm resonator s1. Further, the resonant frequency fr9 of the resonance circuit in which the capacitor C9 is connected to the series arm resonator s1 in parallel is the same as the resonant frequency fr1 of the simple series arm resonator s1. That is, the resonance band width of the above-mentioned resonance circuit is narrower than the resonance band width of the series arm resonator s1.

With this, in the filter according to this modification, the attenuation slopes of the second stop band can be steepened.

Further, as the configuration for adjusting the resonance band width of the acoustic wave series resonance circuit, the series arm resonators s1 and s2 may each utilize different one of the following acoustic waves. That is, the series arm resonators s1 and s2 may utilize any of the following acoustic waves:

(1) Love waves that propagate through an approximately −11° to 0° Y-cut X-propagation LiNbO$_3$ piezoelectric substrate;
(2) Rayleigh waves that propagate through an approximately 126° to 130° Y-cut X-propagation LiNbO$_3$ piezoelectric substrate; and
(3) Leaky waves that propagate through an approximately 42° Y-cut X-propagation LiTaO$_3$ piezoelectric substrate. Here, an acoustic wave type that is used by the series arm resonator s1 and an acoustic wave type that is used by the series arm resonator s2 are different from each other. The above-mentioned acoustic waves achieve narrower resonance band widths in order from (2), (3), and (1).

With this, the attenuation band width and attenuation slopes of the second stop band can be adjusted more freely.

Embodiment 2

In the present embodiment, there is described the configuration of a filter obtained by adding circuit elements, such as an inductor and a capacitor, to the acoustic wave series resonance circuit of the filter 1 to achieve a pass band and a stop band that support the Cellular® band including the fourth generation mobile communication system (4G) and the fifth generation mobile communication system (5G), and the Global Positioning System® (GPS).

Figure 6A:
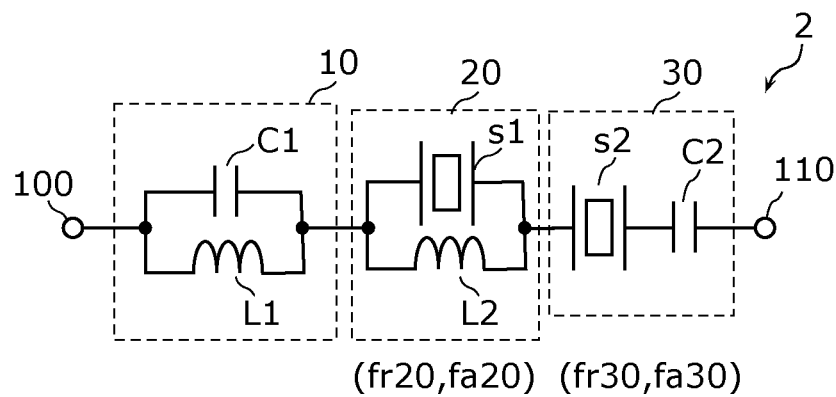
FIG. 6A is a circuit configuration diagram of a filter device according to Embodiment 2.

FIG. 6A is a circuit configuration diagram of a filter 2 according to Embodiment 2. The filter 2 is an example of the filter device, and includes, as illustrated in FIG. 6A, the input/output terminals 100 and 110, the LC parallel resonance circuit 10, a parallel connection circuit 20, and a series connection circuit 30. The filter 2 according to the present embodiment is different from the filter 1 according to Embodiment 1 in that an inductor or a capacitor is connected to the series arm resonators s1 and s2. Now, the filter 2 according to the present embodiment is described in terms mainly of different points from the filter 1 according to Embodiment 1. The description of points of the filter 2 that are the same as those of the filter 1 is omitted.

The parallel connection circuit 20 includes the series arm resonator s1 and an inductor L2. The series arm resonator s1 and the inductor L2 are connected to each other in parallel. Note that, a resonant frequency fr20 and an anti-resonant frequency fa20 of the parallel connection circuit 20 are defined. The parallel connection circuit 20 has similar resonance characteristics to the resonance circuit illustrated in FIGS. 5CA and 5CB so that the anti-resonant frequency fa20 is positioned on the high frequency side of the anti-resonant frequency fa1 of the simple series arm resonator s1. Further, the resonant frequency fr20 is the same as the resonant frequency fr1 of the simple series arm resonator s1. That is, the resonance band width of the parallel connection circuit 20 is wider than the resonance band width of the series arm resonator s1.

The series connection circuit 30 includes the series arm resonator s2 and a capacitor C2. The series arm resonator s2 and the capacitor C2 are connected to each other in series. Note that, a resonant frequency fr30 and an anti-resonant frequency fa30 of the series connection circuit 30 are defined. The series connection circuit 30 has similar resonance characteristics to the resonance circuit illustrated in FIGS. 5BA and 5BB so that the resonant frequency fr30 is positioned on the high frequency side of the resonant frequency fr1 of the simple series arm resonator s1. Further, the anti-resonant frequency fa30 is the same as the anti-resonant frequency fa1 of the simple series arm resonator s1. That is, the resonance band width of the series connection circuit 30 is narrower than the resonance band width of the series arm resonator s1.

Figure 6B:
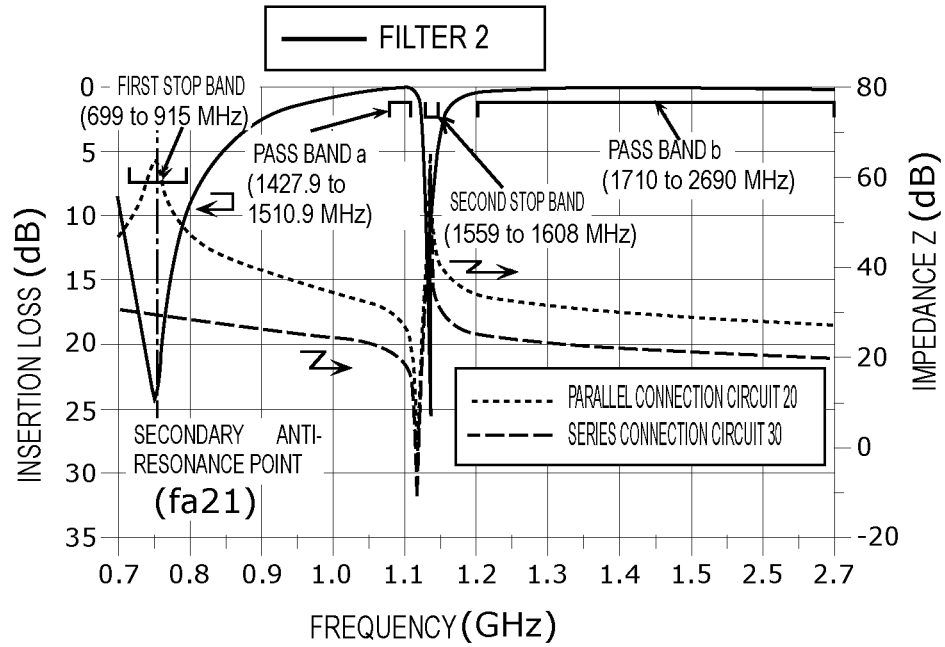
FIG. 6B is a graph illustrating the bandpass characteristics of the filter device according to Embodiment 2, and the impedance characteristics of a parallel connection circuit and a series connection circuit.

FIG. 6B is a graph illustrating the bandpass characteristics of the filter 2 according to Embodiment 2, and the impedance characteristics of the parallel connection circuit 20 and the series connection circuit 30.

The LC parallel resonance circuit 10 forms a wide and low-loss first pass band including a pass band a and a pass band b that are illustrated in FIG. 6B, and a wide first stop band corresponding to the LC parallel resonant frequency of the inductor L1 and the capacitor C1. Note that, in the present embodiment, the pass band a corresponds to 1427.9 to 1510.9 MHz, for example, and the pass band b corresponds to 1710 to 2690 MHz, for example. The combined band of the pass bands a and b corresponds, for example, to the combined band of the middle low band, middle band, and high band of the cellular band. Further, the first stop band corresponds, for example, to the low band of the cellular band (699 to 915 MHz).

Meanwhile, the parallel connection circuit 20 and the series connection circuit 30 form a narrow and steep second stop band corresponding to the anti-resonant frequencies fa20 and fa30. Note that, in the present embodiment, the second stop band corresponds, for example, to the GPS band (1559 to 1608 MHz).

Figure 6C:
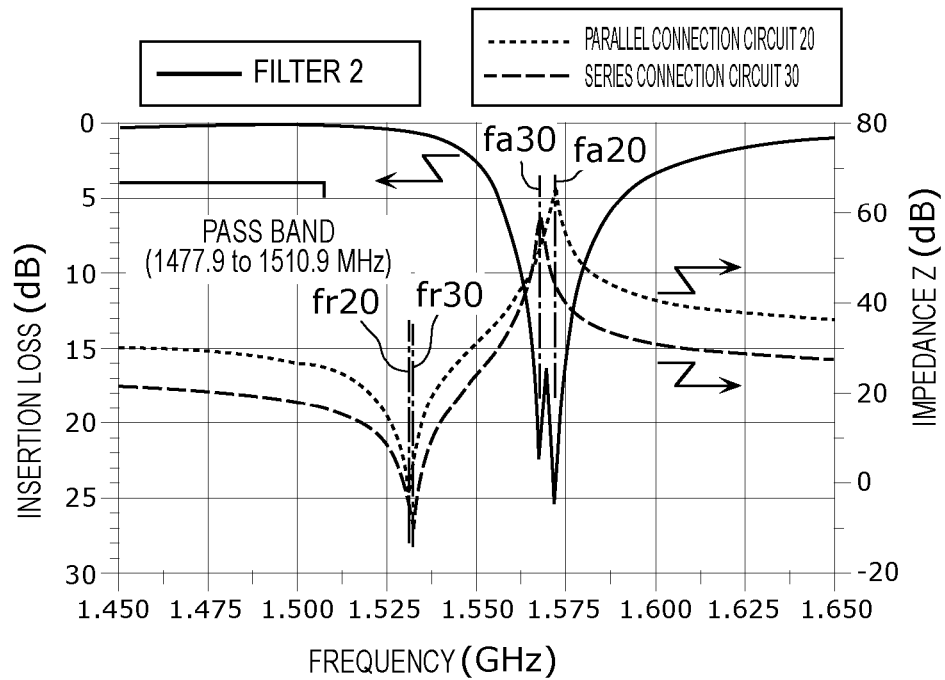
FIG. 6C is a graph illustrating the bandpass characteristics near the second stop band of the filter device according to Embodiment 2, and the impedance characteristics near the second stop band of the parallel connection circuit and the series connection circuit.

FIG. 6C is a graph illustrating the bandpass characteristics near the second stop band of the filter 2 according to Embodiment 2, and the impedance characteristics near the second stop band of the parallel connection circuit 20 and the series connection circuit 30.

As illustrated in FIG. 6C, the attenuation poles of the second stop band of the filter 2 are defined by the anti-resonant frequency fa20 of the parallel connection circuit 20 and the anti-resonant frequency fa30 of the series connection circuit 30. Here, the low-frequency-side attenuation slope of the second stop band is defined by a resonance band width that is a frequency difference between the resonant frequencies fr30 and fr20 and the anti-resonant frequencies fa30 and fa20. That is, as the resonance band width is widened, the attenuation slope becomes gentle, and as the resonance band width is narrowed, the attenuation slope becomes steep.

In the filter 2 according to the present embodiment, while the second stop band is widened by the parallel connection circuit 20 having the relatively wide resonance band width, the low-frequency-side attenuation slope of the second stop band is steepened by the series connection circuit 30 having the relatively narrow resonance band width.

Moreover, a secondary anti-resonant frequency fa21 generated by the parallel connection circuit 20 is included in the first stop band. With this, the filter 2 according to the present embodiment achieves the first stop band having an attenuation larger than that of the filter 1 according to Embodiment 1 in which the first stop band is formed only by the LC parallel resonance circuit 10.

As described above, the filter 2 according to the present embodiment can have the wide and low-loss first pass band (the combined band of the middle low band, middle band, and high band of the cellular band), the wide and high-attenuation first stop band (the low band of the cellular band), and the narrow and steep second stop band (GPS band).

Embodiment 3

In the present embodiment, the configuration of a multiplexer including the filter 1 according to Embodiment 1 or the filter 2 according to Embodiment 2 is described.

Figure 7A:
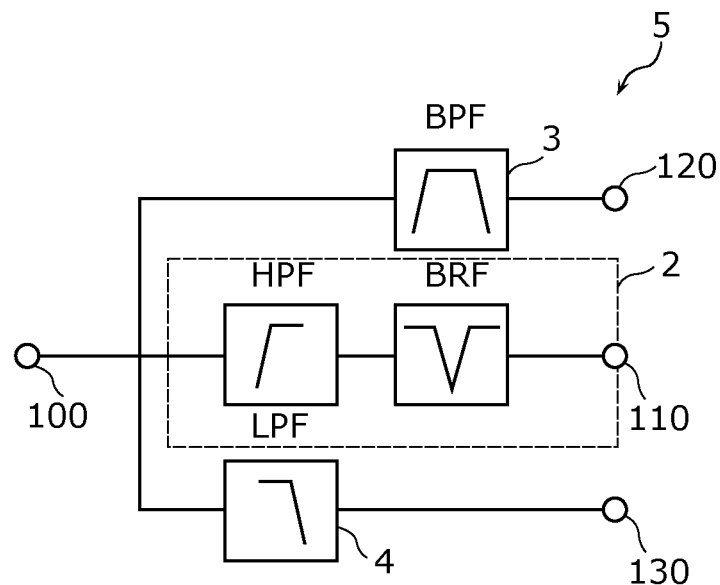
FIG. 7A is a circuit configuration diagram of a multiplexer according to Embodiment 3.

FIG. 7A is a circuit configuration diagram of a multiplexer 5 according to Embodiment 3. As illustrated in FIG. 7A, the multiplexer 5 includes filters 2, 3, and 4, and input/output terminals 100, 110, 120, and 130.

The input/output terminal 100 is a common terminal to which the filters 2, 3, and 4 are connected.

The filter 2 is the filter 2 according to Embodiment 2, and is connected to the input/output terminal 100. The filter 2 includes the LC parallel resonance circuit 10 (high pass filter: HPF), the parallel connection circuit 20, and the series connection circuit 30 (band reject filter: BRF). With this, the filter 2 has the wide and low-loss first pass band (the combined band of the middle low band, middle band, and high band of the cellular band), the wide and high-attenuation first stop band (the low band of the cellular band), and the narrow and steep second stop band (GPS band).

The filter 3 is an example of a second filter, and is connected to the input/output terminal 100. The filter 3 is, for example, a band pass filter including a plurality of acoustic wave resonators, and having a narrow pass band including the second stop band.

The filter 4 is an example of a first filter, and is connected to the input/output terminal 100. The filter 4 is, for example, a low pass LC filter including an inductor and a capacitor, and having a wide pass band including the first stop band.

Note that, the multiplexer 5 may include, instead of the filter 2, the filter 1 according to Embodiment 1.

Figure 7B:
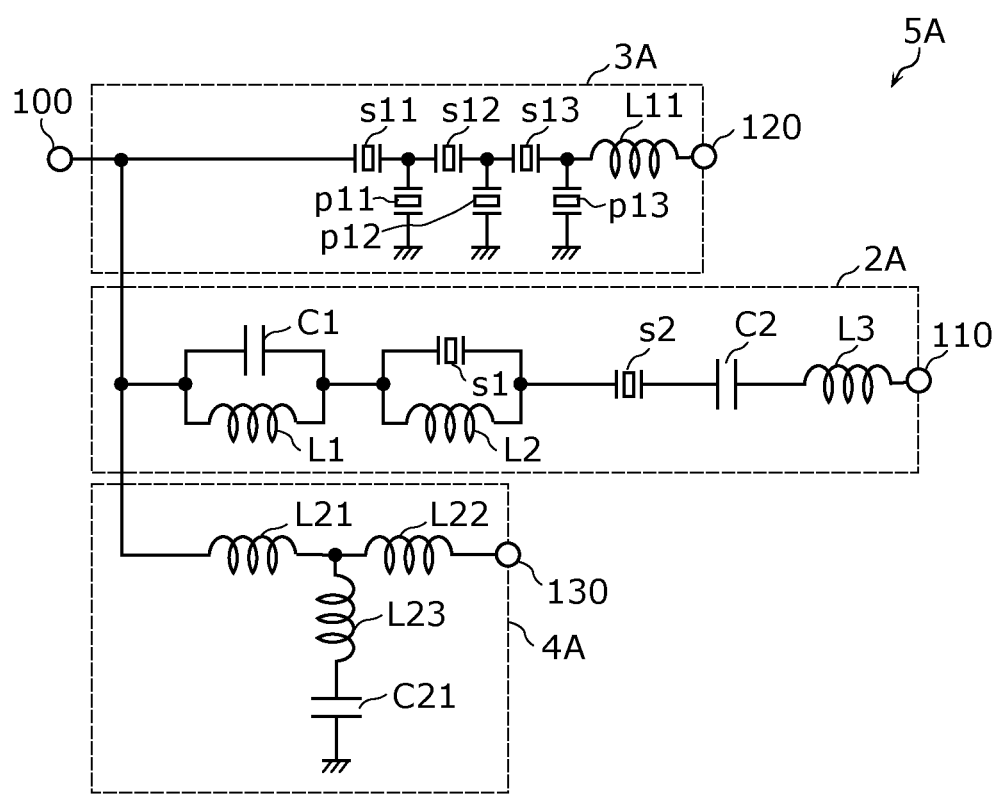
FIG. 7B is a specific circuit configuration diagram of a multiplexer according to Embodiment 3.

FIG. 7B is a specific circuit configuration diagram of a multiplexer 5A according to Embodiment 3. The multiplexer 5A is an example of the multiplexer 5 according to Embodiment 3. As illustrated in FIG. 7B, the multiplexer 5A includes filters 2A, 3A, and 4A, and the input/output terminals 100, 110, 120, and 130.

The filter 2A includes, in addition to the components of the filter 2, an inductor L3 connected between the capacitor C2 and the input/output terminal 110.

The filter 3A includes series arm resonators s11, s12, and s13, parallel arm resonators p11, p12, and p13, and an inductor L11. The series arm resonators s11, s12, and s13 are disposed in series on the path that connects the input/output terminal 100 and the input/output terminal 120 to each other. The parallel arm resonators p11, p12, and p13 are connected between the above-mentioned path and the ground. The inductor L11 is connected between the parallel arm resonator p13 and the input/output terminal 120. With this, the filter 3A forms a ladder filter having a pass band that is the narrow second stop band (GPS band).

The filter 4A includes inductors L21, L22, and L23, and a capacitor C21. The inductors L21 and L22 are disposed in series on the path that connects the input/output terminal 100 and the input/output terminal 130 to each other. A series connection circuit including the inductor L23 and the capacitor C21 is connected between the ground and the connection node between the inductors L21 and L22. With this, the filter 4A forms a low pass LC filter having a pass band that is the wide first stop band (low band).

Figure 7C:
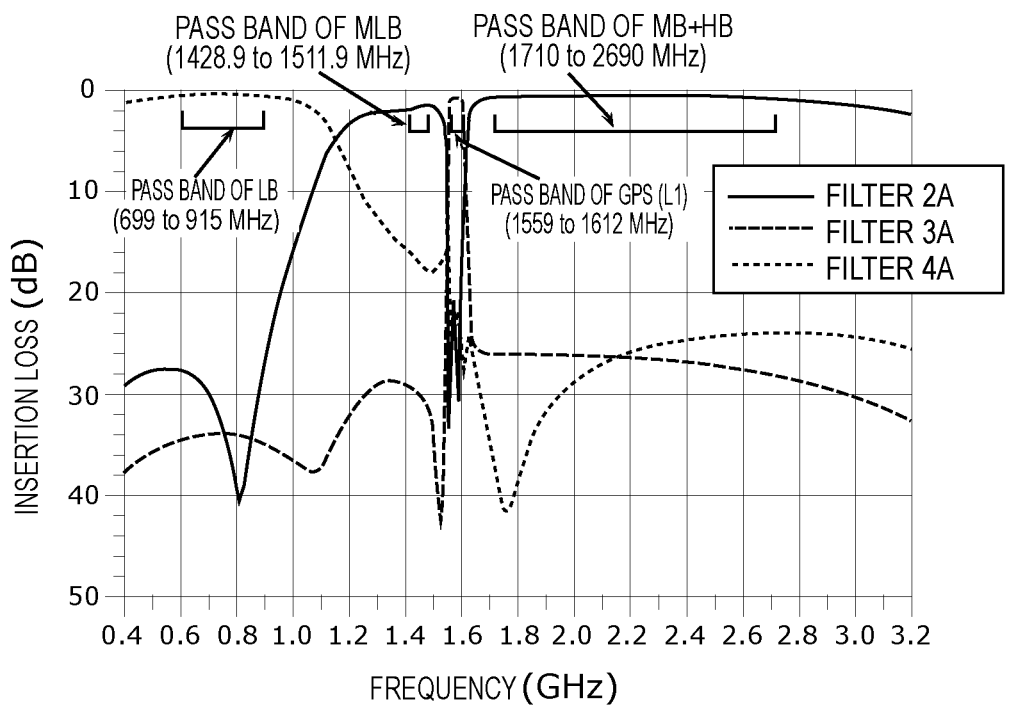
FIG. 7C is a graph illustrating the bandpass characteristics of the multiplexer according to Embodiment 3.

FIG. 7C is a graph illustrating the bandpass characteristics of the multiplexer 5A according to Embodiment 3. FIG. 7C illustrates the bandpass characteristics between the input/output terminals 100 and 110 of the filter 2A, the bandpass characteristics between the input/output terminals 100 and 120 of the filter 3A, and the bandpass characteristics between the input/output terminals 100 and 130 of the filter 4A under a state where the filters 2A, 3A, and 4A are collectively connected to the input/output terminal 100.

As illustrated in FIG. 7C, it is found that the filter 2A has the wide and low-loss first pass band (the combined band of the middle low band, middle band, and high band of the cellular band), the wide and high-attenuation first stop band (the low band of the cellular band), and the narrow and steep second stop band (GPS band). Due to the bandpass characteristics of the filter 2A, the filter 3A can achieve low loss in the narrow pass band, and the filter 4A can achieve low loss in the wide pass band. That is, due to the bandpass characteristics of the filter 2A, the isolation between the filters 2A, 3A, and 4A can be enhanced, and low loss in the filters 2A, 3A, and 4A can be achieved.

Embodiment 4

In the present embodiment, the configuration of a communication device including the multiplexer 5 according to Embodiment 3 is described.

Figure 8:
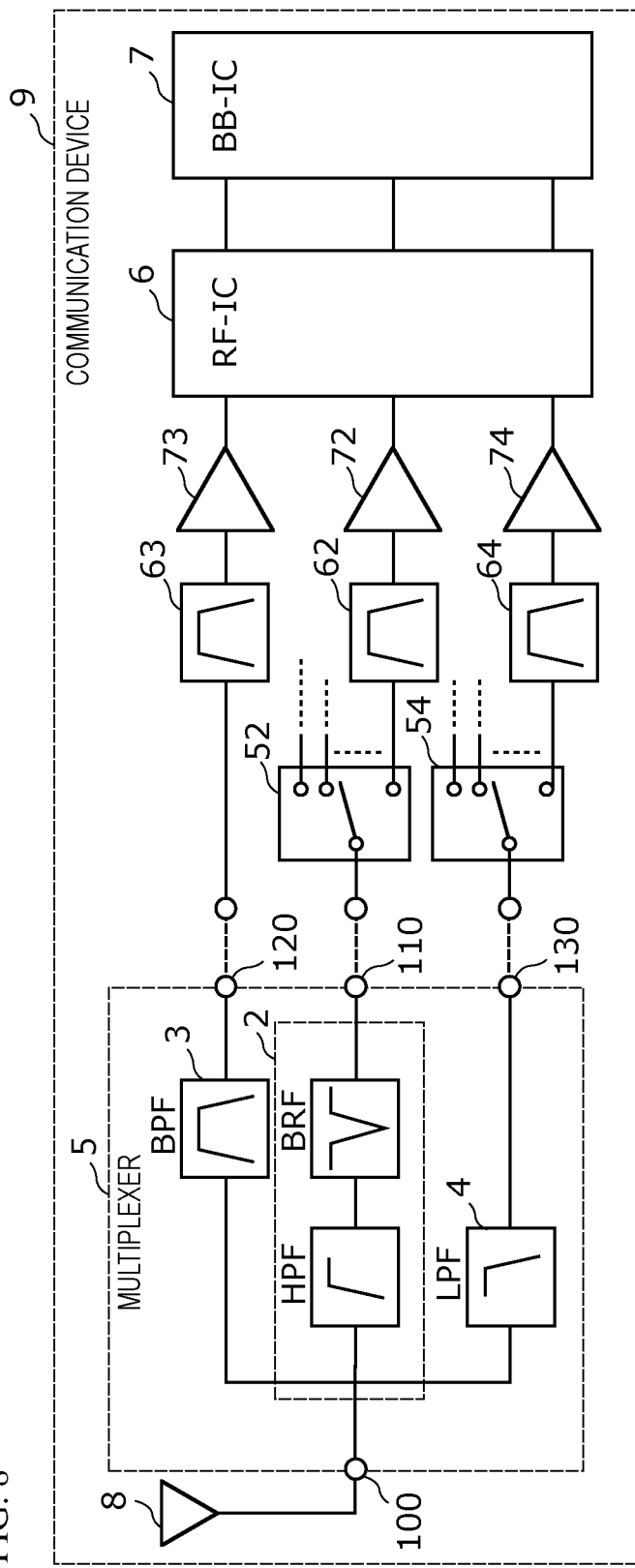
FIG. 8 is a circuit configuration diagram of a communication device according to Embodiment 4.

FIG. 8 is a circuit configuration diagram of a communication device 9 according to Embodiment 4. As illustrated in FIG. 8, the communication device 9 includes the multiplexer 5, an RF signal processing circuit (RFIC) 6, a baseband signal processing circuit (BBIC) 7, an antenna 8, switches 52 and 54, filters 62, 63, and 64, and low noise amplifiers 72, 73, and 74.

The RFIC 6 is an RF signal processing circuit configured to process high-frequency signals that are transmitted or received by the antenna 8. Specifically, the RFIC 6 performs signal processing, such as down conversion on reception signals input through the multiplexer 5, and outputs reception signals generated by the signal processing in question to the BBIC 7. Further, the RFIC 6 performs signal processing, such as up conversion on transmission signals input from the BBIC 7, and outputs transmission signals generated by the signal processing in question to the multiplexer 5.

The BBIC 7 is a circuit configured to perform signal processing using an intermediate frequency band lower than high-frequency signals that are transmitted through the multiplexer 5. The signals processed by the BBIC 7 are used as, for example, image signals for image display or voice signals for a call using a speaker.

The switch 52 has a common terminal and a plurality of selection terminals. The common terminal of the switch 52 is connected to the input/output terminal 110. The plurality of selection terminals of the switch 52 are connected to respective reception paths for transmitting reception signals in a communication band belonging to any of the middle low band, middle band, and high band of the cellular band. In this connection configuration, the switch 52 switches the connections between the filter 2 and the reception paths.

The switch 54 has a common terminal and a plurality of selection terminals. The common terminal of the switch 54 is connected to the input/output terminal 130. The plurality of selection terminals of the switch 54 are connected to respective reception paths for transmitting reception signals in a communication band belonging to the low band of the cellular band. In this connection configuration, the switch 54 switches the connections between the filter 4 and the reception paths.

The filter 62 is disposed on a reception path for transmitting reception signals in a communication band belonging to any of the middle low band, middle band, and high band of the cellular band. The filter 63 is disposed on a reception path for transmitting reception signals in the GPS band. The filter 64 is disposed on a reception path for transmitting reception signals in a communication band belonging to the low band of the cellular band.

The low noise amplifier 72 can amplify, with low noise, reception signals in a communication band belonging to any of the middle low band, middle band, and high band of the cellular band, and is connected between the output terminal of the filter 62 and the RFIC 6. The low noise amplifier 73 can amplify reception signals in the GPS band with low noise, and is connected between the output terminal of the filter 63 and the RFIC 6. The low noise amplifier 74 can amplify, with low noise, reception signals in a communication band belonging to the low band of the cellular band, and is connected between the output terminal of the filter 64 and the RFIC 6.

The antenna 8 is connected to the input/output terminal 100. The antenna 8 emits high-frequency signals output from the multiplexer 5, and receives high-frequency signals from the outside and outputs the high-frequency signals to the multiplexer 5.

Note that, between the multiplexer 5 and the RFIC 6, there may be added a transmission path for transmitting transmission signals in a communication band belonging to any of the low band, middle low band, middle band, and high band of the cellular band.

Further, in the communication device 9 according to the present embodiment, the antenna 8, the BBIC 7, the switches 52 and 54, the filters 62 to 64, and the low noise amplifiers 72 to 74 are optional components.

With the above-mentioned configuration, there can be provided the communication device 9 capable of executing high-isolation and low-loss demultiplexing or multiplexing, or demultiplexing and multiplexing of high-frequency signals in a communication band belonging to any of the middle low band, middle band, and high band of the cellular band, high-frequency signals in the GPS band, and high-frequency signals in a communication band belonging to the low band of the cellular band.

(Effects or the Like)

As described above, the filter 1 according to Embodiment 1 includes: the input/output terminals 100 and 110; the LC parallel resonance circuit 10 that includes the inductor L1 and the capacitor C1 connected to each other in parallel; and the acoustic wave series resonance circuit that includes the series arm resonators s1 and s2 connected to each other in series. The LC parallel resonance circuit 10 and the acoustic wave series resonance circuit are connected to each other in series between the input/output terminal 100 and the input/output terminal 110.

With the above-mentioned configuration, the wide first pass band and the wide first stop band can be formed by the LC parallel resonance circuit 10, and the narrow and steep second stop band can be formed by the acoustic wave series resonance circuit. Moreover, insertion loss in the end portion of the first pass band that is adjacent to the second stop band can be reduced by the combined circuit of the acoustic wave series resonance circuit and the LC parallel resonance circuit 10.

Further, in the filter 1, the LC parallel resonance circuit 10 may have the first pass band and the first stop band that corresponds to the LC parallel resonant frequency. The acoustic wave series resonance circuit may have the second stop band that corresponds to the anti-resonant frequency fa1 of the series arm resonator s1 and the anti-resonant frequency fa2 of the series arm resonator s2. The second stop band may be included in the frequency range of the first pass band.

With this, the narrow and steep second stop band can be formed in the first pass band.

Further, in the filter 1, the anti-resonant frequency fa1 of the series arm resonator s1 and the anti-resonant frequency fa2 of the series arm resonator s2 may be different from each other.

With this, the attenuation band width of the second stop band can be adjusted depending on a frequency difference between the anti-resonant frequency fa1 and the anti-resonant frequency fa2.

Further, the filter 1 may further include the inductor L6 connected to one of the series arm resonators s1 and s2 in series.

With this, the band width of the second stop band can be widened.

Further, the filter 1 may further include the inductor L8 connected to one of the series arm resonators s1 and s2 in parallel.

With this, the band width of the second stop band can be widened.

Further, the filter 1 may further include the capacitor C7 connected to one of the series arm resonators s1 and s2 in series.

With this, the attenuation slopes of the second stop band can be steepened.

Further, the filter 1 may further include the capacitor C9 connected to one of the series arm resonators s1 and s2 in parallel.

With this, the attenuation slopes of the second stop band can be steepened.

Further, in the filter 1, the series arm resonators s1 and s2 may each utilize different one of the following:
  (1) A Love wave that propagates through an approximately −11° to 0° Y-cut X-propagation $LiNbO_3$ piezoelectric substrate;
  (2) A Rayleigh wave that propagates through an approximately 126° to 130° Y-cut X-propagation $LiNbO_3$ piezoelectric substrate; and
  (3) A Leaky wave that propagates through an approximately 42° Y-cut X-propagation $LiTaO_3$ piezoelectric substrate.

With this, narrower resonance band widths can be achieved in order from (2), (3), and (1) so that the attenuation band width and attenuation slopes of the second stop band can be adjusted more freely.

Further, in the filter 2 according to Embodiment 2, the first pass band may include the frequency band of 1427.9 MHz to 1510.9 MHz and the frequency band of 1710 MHz to 2690 MHz, the first stop band may include the frequency band of 699 MHz to 915 MHz, and the second stop band may include the frequency band of 1559 MHz to 1608 MHz.

With this, the filter 2 can have the wide and low-loss first pass band (the combined band of the middle low band, middle band, and high band of the cellular band), the wide and high-attenuation first stop band (the low band of the cellular band), and the narrow and steep second stop band (GPS band).

Further, the multiplexer 5 according to Embodiment 3 includes: the filter 2 that is connected to the input/output terminal 100; the filter 4 that is connected to the input/output terminal 100, and has the pass band that includes the first stop band; and the filter 3 that is connected to the input/output terminal 100, and has the pass band that includes the second stop band. The filter 4 is an LC filter, and the filter 3 is an acoustic wave filter.

With this, the filter 2 has the wide and low-loss first pass band, the wide and high-attenuation first stop band, and the narrow and steep second stop band so that the filter 3 can achieve low loss in the narrow pass band, and the filter 4 can achieve low loss in the wide pass band. Thus, the isolation between the filters 2, 3, and 4 can be enhanced, and low loss in each filter can be achieved.

Further, the communication device 9 includes: the RFIC 6 configured to process a high-frequency signal that is transmitted or received by the antenna 8; and the multiplexer 5 configured to transmit the high-frequency signal between the antenna 8 and the RFIC 6.

With this, there can be provided the communication device 9 capable of executing high-isolation and low-loss demultiplexing or multiplexing, or demultiplexing and multiplexing of high-frequency signals in a communication band belonging to any of the middle low band, middle band, and high band of the cellular band, high-frequency signals in the GPS band, and high-frequency signals in a communication band belonging to the low band of the cellular band.

Other Embodiments or the Like

Although the filter device, the multiplexer, and the communication device according to the embodiments of the present disclosure have been described above using the embodiments, the examples, and the modifications, the filter device, the multiplexer, and the communication device according to the present disclosure are not limited to the above-mentioned embodiments, examples, and modifications. Other embodiments that are realized by combining any components in the above-mentioned embodiments, examples, and modifications, modifications that can be obtained by modifying the above-mentioned embodiments, examples, and modifications by persons skilled in the art without necessarily departing from the gist of the present disclosure, and various types of equipment incorporating the above-mentioned filter device, multiplexer, and communication device are also included in the present disclosure.

For example, in the filter device, the multiplexer, and the communication device according to the above-mentioned embodiments, examples, and modifications, other circuit elements, wiring, or the like may be inserted between the paths that connect the respective circuit elements and the signal paths, which are disclosed in the drawings, to each other.

The present disclosure can be utilized in a filter device, a multiplexer, and a communication device that are disposed in a multiband front end unit, and can be variously utilized in communication equipment, such as mobile phones, including the filter device, the multiplexer, and the communication device.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:
1. A filter device comprising:
  a first input/output terminal and a second input/output terminal;

an LC parallel resonance circuit comprising a first inductor and a first capacitor connected to each other in parallel; and an acoustic wave series resonance circuit comprising a first acoustic wave resonator and a second acoustic wave resonator connected to each other in series, wherein the LC parallel resonance circuit and the acoustic wave series resonance circuit are connected to each other in series between the first input/output terminal and the second input/output terminal, wherein the LC parallel resonance circuit has a first pass band, and a first stop band that corresponds to a resonant frequency of the LC parallel resonance circuit, wherein the acoustic wave series resonance circuit has a second stop band that corresponds to an anti-resonant frequency of the first acoustic wave resonator and an anti-resonant frequency of the second acoustic wave resonator, and wherein the second stop band is within a frequency range of the first pass band.

2. The filter device according to claim 1, wherein the anti-resonant frequency of the first acoustic wave resonator and the anti-resonant frequency of the second acoustic wave resonator are different from each other.

3. The filter device according to claim 1, further comprising:
a third inductor connected in series with the first acoustic wave resonator or the second acoustic wave resonator.

4. The filter device according to claim 1, further comprising:
a fourth inductor connected in parallel to the first acoustic wave resonator or the second acoustic wave resonator.

5. The filter device according to claim 1, further comprising:
a third capacitor connected in series with the first acoustic wave resonator or the second acoustic wave resonator.

6. The filter device according to claim 1, further comprising:
a fourth capacitor connected in parallel to the first acoustic wave resonator or the second acoustic wave resonator.

7. The filter device according to claim 1, wherein the first acoustic wave resonator and the second acoustic wave resonator each utilize a different one of the following:
(1) A Love wave that propagates through a −11° to 0° Y-cut X-propagation LiNbO3 piezoelectric substrate;
(2) A Rayleigh wave that propagates through a 126° to 130° Y-cut X-propagation LiNbO3 piezoelectric substrate; and
(3) A Leaky wave that propagates through a 42° Y-cut X-propagation LiTaO3 piezoelectric substrate.

8. The filter device according to claim 1, wherein:
the first pass band comprises a frequency band of 1427.9 MHz to 1510.9 MHz and a frequency band of 1710 MHz to 2690 MHZ,
the first stop band comprises a frequency band of 699 MHz to 915 MHz, and
the second stop band comprises a frequency band of 1559 MHz to 1608 MHz.

9. The filter device according to claim 1, further comprising:
a fourth inductor connected in parallel to the first acoustic wave resonator; and
a third capacitor connected in series with the second acoustic wave resonator.

10. The filter device according to claim 9, further comprising:
a parallel connection circuit comprising the first acoustic wave resonator in parallel with the fourth inductor; and
a series connection circuit comprising the second acoustic wave resonator in series with the third capacitor.

11. A multiplexer comprising:
the filter device according to claim 1 that is connected to a common terminal;
a first filter that is connected to the common terminal, and that has a pass band that comprises the first stop band; and
a second filter that is connected to the common terminal, and that has a pass band that comprises the second stop band, wherein:
the first filter is an LC filter, and
the second filter is an acoustic wave filter.

12. A communication device comprising:
a radio frequency (RF) signal processing circuit configured to process a high-frequency signal that is transmitted or received by an antenna; and
the multiplexer according to claim 11 configured to pass the high-frequency signal between the antenna and the RF signal processing circuit.

* * * * *